United States Patent
Perthold

(10) Patent No.: US 10,707,811 B2
(45) Date of Patent: Jul. 7, 2020

(54) NOISE GENERATOR

(71) Applicant: Innovationszentrum für Telekommunikationstechnik GmbH IZT, Erlangen (DE)

(72) Inventor: Rainer Perthold, Weisendorf (DE)

(73) Assignee: Innovationszentrum für Telekommunikationstechnik GmbH IZT, Erlangen (DE)

( * ) Notice: Subject to any disclaimer, the term of this patent is extended or adjusted under 35 U.S.C. 154(b) by 178 days.

(21) Appl. No.: 15/891,685

(22) Filed: Feb. 8, 2018

(65) Prior Publication Data
US 2018/0167033 A1 Jun. 14, 2018

Related U.S. Application Data

(63) Continuation of application No. PCT/EP2016/068872, filed on Aug. 8, 2016.

(30) Foreign Application Priority Data

Aug. 10, 2015 (DE) .................. 10 2015 215 222

(51) Int. Cl.
*H03B 29/00* (2006.01)
*B06B 1/02* (2006.01)
(Continued)

(52) U.S. Cl.
CPC ........... *H03B 29/00* (2013.01); *B06B 1/0223* (2013.01); *G06F 1/025* (2013.01); *H03F 1/3247* (2013.01);
(Continued)

(58) Field of Classification Search
CPC ........ H03F 1/3247; H03F 1/3252; H03F 1/32; H04B 1/123; H04B 1/0483; H04B 1/10;
(Continued)

(56) References Cited

U.S. PATENT DOCUMENTS 5,153,532 A 10/1992 Albers et al.
6,831,955 B1 12/2004 Takahashi
(Continued)

FOREIGN PATENT DOCUMENTS

DE 102009004577 A1 7/2010
JP 2001185998 A 7/2001

OTHER PUBLICATIONS

Douglass A. Mann Interpolated FIR Filters: A Case Study Nov. 14, 2008.*

(Continued)

*Primary Examiner* — Arnold M Kinkead
(74) *Attorney, Agent, or Firm* — Michael A. Glenn; Perkins Coie LLP

(57) ABSTRACT

A noise generator for generating a noise signal over a frequency spectrum has a first noise source and a first digital filter for a first frequency band, a second noise source and a second digital filter for a second frequency band, and an interpolator and a combiner. The first digital filter has a first sample rate and the second digital filter has a second sample rate, wherein the ratio between the second sample rate and the first sample rate, with regard to a sign, corresponds to a ratio between center frequencies of the second frequency band and the first frequency band, wherein an edge of the second digital filters which determines a lower frequency band limit is steeper than an edge of the first digital filter which determines an upper frequency band limit. The interpolator is configured to adjust an output signal of the first digital filter, with regard to its sample rate, to a sample rate of the second digital filter, wherein the combiner is configured to combine the adjusted output signal from the interpolator and the output signal of the second digital filter.

18 Claims, 3 Drawing Sheets

(51) Int. Cl.
  *G06F 1/025* (2006.01)
  *H04B 1/10* (2006.01)
  *H04L 7/00* (2006.01)
  *G10L 21/0208* (2013.01)
  *H03H 17/00* (2006.01)
  *H03K 3/84* (2006.01)
  *H04B 1/04* (2006.01)
  *H04B 1/12* (2006.01)
  *H03F 1/32* (2006.01)

(52) U.S. Cl.
  CPC ......... *H03F 1/3252* (2013.01); *H04B 1/0483* (2013.01); *H04B 1/10* (2013.01); *H04B 1/123* (2013.01); *H04L 7/0025* (2013.01); *G10L 21/0208* (2013.01); *H03H 2017/0081* (2013.01); *H03K 3/84* (2013.01)

(58) Field of Classification Search
  CPC .. H04B 1/04; H04B 1/12; H03B 29/00; G06F 1/025; B06B 1/02; H04L 7/00; G10L 21/028; H03H 17/00
  USPC ............... 455/296, 91; 704/211; 702/106
  See application file for complete search history.

(56) References Cited

U.S. PATENT DOCUMENTS

| | | |
|---|---|---|
| 8,159,280 B2 | 4/2012 | Appel et al. |
| 2006/0186930 A1 | 8/2006 | Klage |
| 2010/0176867 A1 | 7/2010 | Appel et al. |

OTHER PUBLICATIONS

Park, Jongsun et al., "Efficient generation of 1/fα noise using a multi-rate filter bank", Custom Integrated Circuits Conference; (Proceedings of the IEEE 2003), pp. 707-710; 2003.

\* cited by examiner

NOISE GENERATOR

CROSS-REFERENCE TO RELATED APPLICATIONS

This application is a continuation of copending International Application No. PCT/EP2016/068872, filed Aug. 8, 2016, which is incorporated herein by reference in its entirety, and additionally claims priority from German Application No. 102015215222.7, filed Aug. 10, 2015, which is also incorporated herein by reference in its entirety.

BACKGROUND OF THE INVENTION

Embodiments of the present invention relate to a noise generator for generating a noise signal, and to a corresponding method.

Noise generators may, for example, be applied in channel simulators simulating the propagation effects and the impairment of signals by analog processing stages.

One of these disturbing influences to be simulated may, for example, be the so-called "phase noise" of oscillators. The simulation for phase noise is usually performed by generating noise characterized or colored in accordance with specifications by the user. This is conventionally obtained from white noise which is then filtered in accordance with specifications by the user. The result of the noise generated in this way may either be used directly as a noise signal and transferred to a phase signal or (advantageously) buffered. The buffered result is exemplarily loaded to an arbitrary generator, reproduced cyclically and applied to a phase modulator which in turn modulates the useful signal.

The technological challenge here is that the real phase noise spectrum is to be simulated exactly over a wide frequency range, like from 1 Hz to 10 MHz, for example, with a dynamics of, for example, 100 dB or more. Furthermore, the period of the signal is to last as long as possible before repeated again.

There are different ways of generating signals in accordance with such requirements, which will be discussed below. The colored noise may, for example, if applicable, be generated on a separate computer using suitably established IIR or FIR filters. When using IIR filters, it is of disadvantage that the estimation method for adjusting the filter coefficient to the frequency response used, due to the high dynamics, use high a filter order and may become numerically unstable. Consequently, the result has to be checked by an experienced user. However, this is not acceptable for an application in a measuring device.

When using FIR filters, the coefficients thereof can easily be estimated reliably. However, the number of coefficients used is very high (like $2^{24}$). This consequently consumes much calculating time and memory when determining the coefficients and subsequently filtering the white noise. An interactive operation by the user and direct implementation in a measuring device can hardly be realized at present.

Irrespective of the filter type used, one problem is that the wide frequency range uses arbitrary generators with a relatively high sample rate (like 20 Msamples/sec) and, at the same time, high a storage depth (like 1000 seconds corresponding to 40 gigabytes) in order to obtain a sufficiently realistic simulation. The amount of time for calculating the noise sequence and loading the arbitrary generator consequently are in the range of minutes and, consequently, inacceptable for the user.

In order to (apparently) improve the repetition rate of the colored noise, a trick may be applied. Instead of generating a single noise signal, two noise signals are generated, the lengths of which are prime to each other. The two are reproduced and added in separate arbitrary generators before being applied to the phase modulator. In the frequency range where the signals of the two arbitrary generators overlap, however, there are frequently deviations from the desired frequency response. A very much longer period (like 207 days) seems to be achievable in this way. In case there are only two noise signals, however, the autocorrelation function of the sum signal is bad and the short repetition durations of the two arbitrary generators become visible.

Consequently, the object underlying the present invention is providing a noise generator for a broad frequency spectrum, which represents an improved compromise between operating convenience, resource efficiency (calculating time and memory requirements) and frequency response deviation.

SUMMARY

According to an embodiment, a noise generator for generating a noise signal over a frequency spectrum may have: a first noise source and a first digital filter for a first frequency band of the frequency spectrum, wherein the first digital filter is configured to filter the output signal of the first noise source; a second noise source and a second digital filter for a second frequency band of the frequency spectrum, wherein the second digital filter is configured to filter the output signal of the second noise source; and an interpolator and a combiner, wherein the first digital filter has a first sample rate, and wherein the second digital filter has a second sample rate, and wherein a sample rate increases with an increasing frequency of the frequency band, wherein the interpolator is configured to adjust an output signal of the first digital filter, with regard to its sample rate, to a sample rate of the second digital filter, and wherein the combiner is configured to combine the adjusted output signal from the interpolator and the output signal of the second digital filter, wherein an edge of the second digital filter which determines a lower frequency band limit is steeper than an edge of the first digital filter which determines an upper frequency band limit.

According to another embodiment, a method for generating a noise signal over a frequency spectrum, may have the steps of: generating an output signal by means of a first noise source for a first frequency band of the frequency spectrum and filtering the output signal of the first noise source; generating an output signal by means of a second noise source for a second frequency band of the frequency spectrum and filtering the output signal of the second noise source, wherein filtering the output signal of the first noise source is performed by means of a first sample rate and filtering the output signal of the second noise source is performed by means of a second sample rate, and wherein a sample rate increases with an increasing frequency of the frequency band, and wherein an edge of the second digital filter which determines a lower frequency band limit is steeper than an edge of the first digital filter which determines an upper frequency band limit; and adjusting a sample rate of the filtered output signal of the first noise source to a sample rate of the filtered output signal of the second noise source and combining the adjusted output signal of the first noise source and the output signal of the second noise source.

Another embodiment may have a non-transitory digital storage medium having stored thereon a computer program for performing a method for generating a noise signal over a frequency spectrum, having the steps of: generating an output signal by means of a first noise source for a first frequency band of the frequency spectrum and filtering the output signal of the first noise source; generating an output signal by means of a second noise source for a second frequency band of the frequency spectrum and filtering the output signal of the second noise source, wherein filtering the output signal of the first noise source is performed by means of a first sample rate and filtering the output signal of the second noise source is performed by means of a second sample rate, and wherein a sample rate increases with an increasing frequency of the frequency band, and wherein an edge of the second digital filter which determines a lower frequency band limit is steeper than an edge of the first digital filter which determines an upper frequency band limit; and adjusting a sample rate of the filtered output signal of the first noise source to a sample rate of the filtered output signal of the second noise source and combining the adjusted output signal of the first noise source and the output signal of the second noise source, when said computer program is run by a computer.

According to still another embodiment, a noise generator for generating a noise signal over a frequency spectrum may have: a first noise source and a first digital filter for a first frequency band of the frequency spectrum, wherein the first digital filter is configured to filter the output signal of the first noise source; a second noise source and a second digital filter for a second frequency band of the frequency spectrum, wherein the second digital filter is configured to filter the output signal of the second noise source; and an interpolator and a combiner, wherein the first digital filter has a first sample rate, and wherein the second digital filter has a second sample rate, and wherein a ratio between the second sample rate and the first sample rate, with regard to a sign, corresponds to a ratio between center frequencies of the second frequency band and the first frequency band, wherein the interpolator is configured to adjust an output signal of the first digital filter, with regard to its sample rate, to a sample rate of the second digital filter, and wherein the combiner is configured to combine the adjusted output signal from the interpolator and the output signal of the second digital filter, wherein an edge of the second digital filter which determines a lower frequency band limit is steeper than an edge of the first digital filter which determines an upper frequency band limit.

Embodiments of the present invention provide a noise generator for generating a noise signal over a frequency spectrum. The noise generator comprises a first noise source and a first digital filter for a first frequency band of the frequency spectrum, a second noise source and a second digital filter for a second frequency band of the frequency spectrum, and an interpolator and a combiner. The first digital filter is configured to filter the output signal of the first noise source, whereas the second digital filter is configured to filter the output signal of the second noise source. The first digital filter comprises a first sample rate, whereas the second digital filter comprises a second sample rate, wherein a ratio between the second sample rate and the first sample rate, regarding a sign, corresponds to a ratio between center frequencies of the second frequency band relative to the first frequency band. The filters here each comprise filter edges predefined at the transition, wherein an edge of the second digital (34) filter which determines the lower frequency band limit is steeper than an edge of the first digital filter (34) which determines an upper frequency band limit. The interpolator is configured to adjust an output signal of the first digital filter, with regard to its sample rate, to a sample rate of the second digital filter, whereas the combiner is configured to combine the adjusted output signal from the interpolator and the output signal of the second digital filter.

The core of the invention is to subdivide, in a noise generator, the frequency response used of the (phase) noise (subsequently referred to as frequency spectrum) into individual frequency bands, like two or several frequency bands, for example. Here, the sample rates of the digital filters along the increasing frequency axis are selected so as to increase, like by a factor of 2 each. Thus, the relative bandwidth of the individual filters can remain constant, whereas the frequency response used can be simulated well in a resource-saving manner by means of short filters, like FIR filters, for example. Before combining or summing up the two bands, the band having a lower sample rate (i.e. the band also having the lower frequency range, cf. center frequency of the band) is adjusted to the sample rate of the second band or brought to the same sample rate as the second band by an interpolator. Starting from a subdivision of the entire frequency spectrum into two bands, this approach allows a realistic simulation of the phase noise of an oscillator. In order to ensure a good frequency response at the transition between the two bands as well, the filter edges (like RCOS edges) are optimized as to the interpolation of the lower band. Thus, the lower edge (lower frequency band limit) of the second digital filter for the upper band is steeper, like double as steep (in dependence on the factor mentioned above), relative to an upper edge (upper frequency band limit) of the first digital filter for the lower band. By means of such a selection, an optimum supplementation of the filter edges of the two bands to form the desired frequency response may be achieved in the overlap region (after the interpolation). A so-called root raised cosine filter which exhibits "smooth" filter edges may be used. The combination of these filter edges with uncorrelated noise sources has the result that there is no deviation from the frequency response sued in the overlap region. This approach is of such an efficiency that (depending on the embodiments) it may also be realized in programmable logic. This easy and realistic generation of (colored) noise is characterized by high operating convenience since the phase noise can be generated without long calculating times or loading times (when compared to arbitrary generators, for example) and starting from numerically stable operations. The very long repetition period and the large frequency range achievable are further advantages.

In accordance with further embodiments, as has been indicated above, the noise generator may also be extended by a third frequency band, i.e. having a third noise source and a third digital filter for the third frequency band of the frequency spectrum. Here, the third digital filter is configured to filter the output signal of the third noise source, wherein the third digital filter comprises a third sample rate, and wherein a ratio between the third sample rate and the second sample rate, with regard to a sign, is a ratio between center frequencies corresponding to the third frequency band relative to the second frequency band. In this embodiment, the noise generator comprises a further interpolator and a further combiner. The further interpolator is configured to adjust an output signal of the combiner, relative to its sample rate, to a sample rate of the third digital filter, and wherein the further combiner is configured to combine an output signal from the further interpolator and the output signal of the third digital filter. In accordance with embodiments, it is of advantage for the ratio between the second sample rate and the first sample rate to remain equal or approximately equal to the ratio between the third sample rate and the second sample rate. In accordance with additional embodiments, the rate using which the sample rates are adjusted, performed by the interpolator is also dependent on this ratio. In accordance with embodiments, the sample rate doubles from the first band to the second band (i.e. ratio 2:1) and from the second band to the third band. This means that the sample rate may also be doubled in the respective interpolator so that, when combining, output signals of equal sample rates are combined. It is to be pointed out here that combining may, for example, be summing up.

In accordance with further embodiments, the filter edges of the different bands are optimized for combining. The steepness of the filter edges is adjusted correspondingly. Thus, at least the second digital filter comprises a filter characteristic according to which the edges comprise a differing steepness. Exemplarily, the edge of lower a transmission characteristic may be double as steep as the edge of higher a transmission characteristic. This also applies for a consideration across filters. Correspondingly, the edge of lower the transmission frequency may also be double as steep as an edge of higher a transmission frequency of the first digital filter.

In accordance with further embodiments, the noise generator may comprise means for level adjustment in at least one path, i.e. for one frequency band. Additionally, in accordance with embodiments, it is also conceivable for the noise generator to be combined, on the output side, with an integrator by means of which the output signals are summed up over time. In accordance with further embodiments, in particular in a combination with the integrator, it would also be possible for means for modulation to be provided on the output side, by means of which the output signal of the noise generator is transferred from a frequency modulation to phase modulation.

BRIEF DESCRIPTION OF THE DRAWINGS

Embodiments of the present invention will be discussed below referring to the drawings in which.

DETAILED DESCRIPTION OF THE INVENTION

Figure 1:
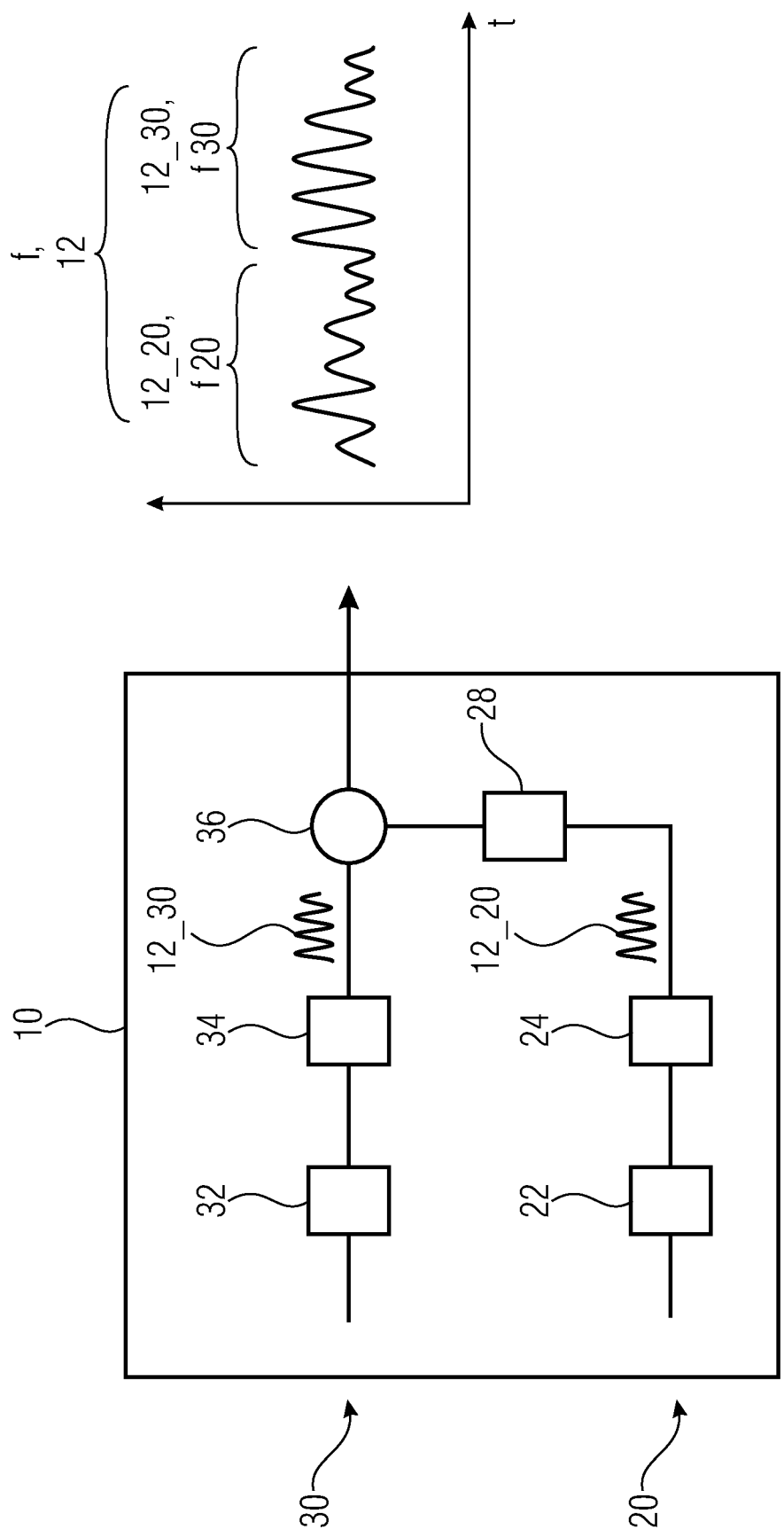
FIG. 1 is a schematic block circuit diagram of a noise generator in accordance with a first embodiment.

Before discussing embodiments of the present invention below in greater detail making reference to the drawings, it is to be pointed out that elements and structures of equal effect are provided with equal reference numerals so that the description thereof is mutually applicable or exchangeable.

FIG. 1 shows a noise generator 10 for generating a noise signal 12 over a frequency spectrum f (from 1 Hz to 10 MHz or to 20 MHz, for example). The noise generator 10 comprises two noise paths 20 and 30.

The first noise path 20 comprises a first noise source 22 and a first digital filter 24 for a first frequency band f 20 of the frequency spectrum f (from 1 Hz to 1 MHz or 5 MHz, for example). The noise source 22 and the digital filter 24 are connected in series such that the output signal of the noise source 22 may be filtered by the digital filter 24. The second path 30 comprises a second noise source 32 and a second digital filter 34 for a second frequency band f 30 (from 1 MHz to 10 MHz or from 5 MHz to 20 MHz, for example). In analogy to the first path 20, the noise source 32 and the digital filter 34 are also connected in series.

The two paths 20 and 30 are connected by a combiner 36 which may, for example, be part of the path 30. The combiner 36 is arranged so as to be able to combine an output signal of the path 20 and an output signal of the second digital filter 34. An interpolator 28 is provided on the path 20 between the second digital filter 24 and the combiner 36. The combiner 36 in this embodiment represents the output of the noise generator 10.

The mode of functioning of the noise generator will be discussed below. The two noise sources 22 and 32 are configured to generate noise or uncorrelated noise, like white noise or adaptive white Gaussian noise (AWGN), for example. This noise is filtered by the filters 24 and 34, advantageously digital filters, like FIR filters or RCC filters, in a subsequent step. Since each path 20 and 30 is associated to a certain frequency band f 20 and f 30, respectively, having a bandwidth limited when compared to the entire frequency band f (i.e. comparatively short FIR filters), the filters 24 and 34 may be more narrow-banded so that the number of coefficients used for generating the colored noise is reduced considerably. Another trick would be selecting different sample rates for the two filters 24 and 34. These may, for example, differ by the factor of 2 so that the filter 24 comprises half the sample rate of the filter 34. This ensures that the relative bandwidth of the individual filters 24 and 34 remains constant. The result is that respective uncorrelated noise signals 12-20 and 12-30 in different frequency bands f 20 and f 30 are output by the two filter banks 24 and 34, the different output signals comprising different sample rates.

In order to combine the two noise signals 12-20 and 12-30 by means of the combiner 36, like a summer, the different sample rates are compensated. Advantageously, the signal having lower the sample rate of path 20 is adjusted to the signal of higher a sample rate from the path 30. This is performed by means of an interpolation, performed by the interpolator 28. The signal adjusted relative to the sample rate may then be summed up by means of the combiner 36 in order to output the noise signal 12 having the frequency spectrum f.

In accordance with embodiments, the ratio between the second sample rate of the second filter 34 and the first sample rate of the first filter 24 is 2.0. Starting here, an interpolation of a factor of 2 is performed by the interpolator 28 so that the signals 12-20 and 12-30 comprise the same sample rate at the combiner 36. In accordance with further embodiments, this factor may also be selected to be different and may, for example, be 4.0 or 1.5. This means that an interpolation factor of 2.0 does not necessarily have to be used, wherein, relative to the resource complexity, it seems to be the best solution to use the factor 2.0 for the interpolation and ratio between the sample rate, since otherwise both the interpolation filters and the FIR filters would use a higher number of coefficients and, at the same time, multiple usage would become more difficult. Generally, it is to be pointed out that the sample rate increases with an increasing frequency of the frequency band. In other words, this correlation may also be expressed such that the ratio between the second sample rate and the first sample rate, relative to the sign, corresponds to a ratio between the center frequencies of the second frequency band f 30 and the first frequency band f 20.

In addition to adjusting the two noise signals 12-20 and 12-30 to be combined relative to the differing sample rates, the filter edges are also adjusted while considering the interpolation performed by the interpolators 28. The adjustment is done on the mutually adjacent (RCOC) edges, i.e. the high-frequency edge of the first frequency band f 20 (edge for defining the upper frequency band limit for the lower frequency band) and the low-frequency edge of the second frequency band f 30 (edge for defining the lower frequency band limit in the upper frequency band). Starting from the ratio of the sample rates of 2.0, double as steep an edge of the lower frequency band f 20 when compared to the edge of the upper frequency band f 30 would have to be selected. In general, it can be stated that a ratio between the steepness of the edge of the second digital (34) filter and the edge of the first digital (34) filter is dependent on the ratio between the second sample rate and the first sample rate. With such a selection, after interpolation, the resulting edges would supplement each other so as to obtain the desired frequency response.

Figure 2A:
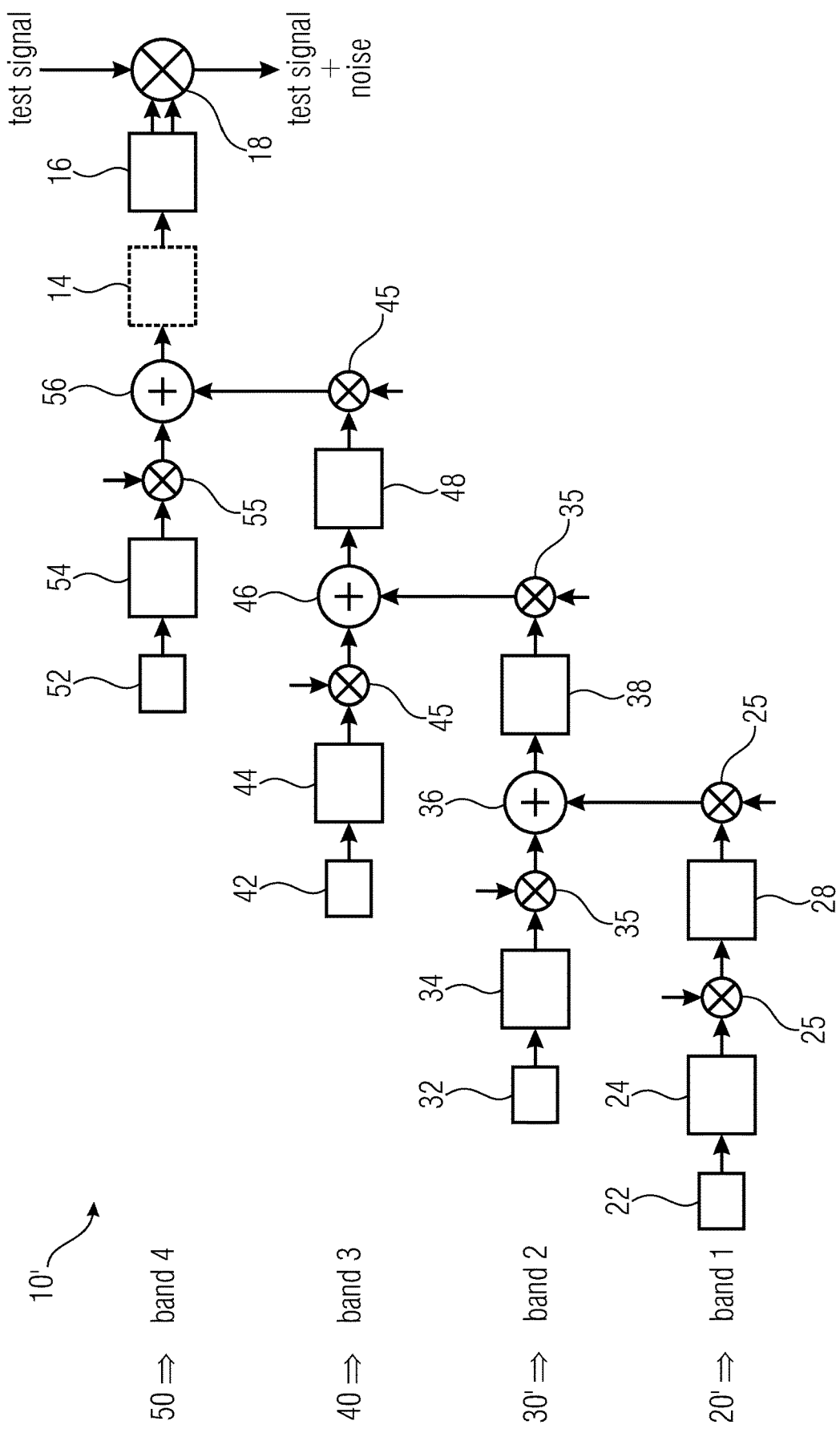
FIG. 2a is a schematic block circuit diagram of a noise generator in accordance with an extended embodiment.
Figure 2B:
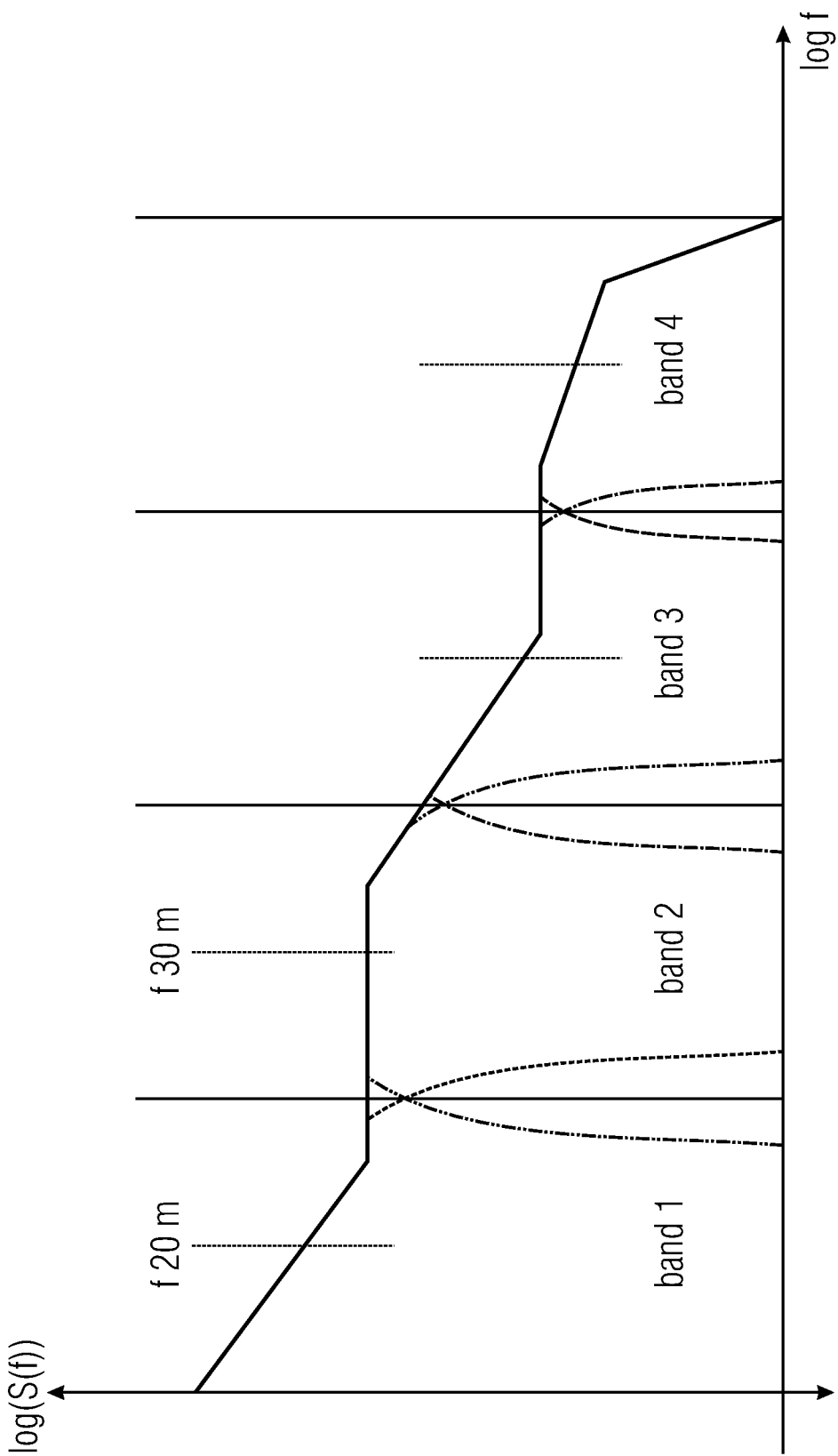
FIG. 2b shows a schematic diagram of a subdivision of the desired noise spectrum into different frequency bands (in logarithmic representation).

FIG. 2a shows an extended embodiment of a noise generator 10' having four paths 20', 30', 40 and 50 altogether for bands 1, 2, 3 and 4 which are illustrated in FIG. 2b in logarithmic representation.

Each path 20', 30', 40 and 50 comprises respective independent noise sources 22, 32, 42 and 52, digital filters 24, 34, 44 and 54 (in this case shaping filters having 31 taps FIR). The paths 20', 30' and 40 additionally comprise the interpolation filters 28, 38 and 48 (in this case 2× interpolation filters with 31 taps FIR), whereas the paths 30', 40 and 50 comprise the combiners 36, 46 and 56, respectively. It is to be pointed out here that the combiners 36 and 46 in paths 30' and 40 are provided on the input side relative to the interpolator 38 and 48. This ensures the sample rate for the overall sum signal in the respective path 30' and 40' to be adjusted to the next higher level of the path 40 or 50.

The result of the noise generator 10' is an easier recursive structure set up from identical interpolation filters 28, 38 and 48 and having short FIR filters 24, 34, 44 and 54 with an increasing sample rate (increasing center frequency of the four sub-bands, band 1-4). The center frequencies in FIG. 2b are exemplarily illustrated by means of broken lines and provided with reference numerals f 20m and f 30m. This structure may also be realized in programmable logic, wherein 31 stages (taps) may also be realized effectively by multiply using the logic resources, for example.

The mode of functioning of the noise generator 10' basically corresponds to the mode of functioning of the noise generator 10, wherein the entire frequency range here is subdivided into four bands altogether (cf. FIG. 2b).

In accordance with embodiments, further elements may be integrated in the noise generator 10'. In accordance with an embodiment, at least one, but advantageously each of the paths 20', 30', 40 and 50 may comprise means for level adjustment 25 and 29, 35 and 39, 45 and 49 and 55. The means 25, 35, 45 and 55 are each provided at the output of the filters 24, 34, 44 and 54, whereas the means 29, 39 and 49 are each provided at the output of filters 28, 38 and 48. The means for level adjustment may, for example, be realized by multipliers. The multiplication factors are typically selected in dependence on the desired frequency response of the noise signal. It is to be pointed out here that it is not absolutely necessary for two means for level adjustment 25/29, 35/39, 45/49 to be provided for each path 20', 30', 40 and 50; however, this is an advantageous embodiment. Rounding mistakes due to the limited word width of the calculation can be minimized by the arrangement of the level adjustment 25, 29, 35, 39, 45, 49 and 55 between the filters 24, 28, 34 38, 44, 48 and 54.

In accordance with further embodiments, an integrator 14 may be provided on the output side in the noise generator 10'. In case the frequency response used of the colored noise decreases considerably steeper than by 20 dB per decade, each allows the requirements to the word width of the calculation in the individual filters to be reduced. The influence of the integrator 14 on the frequency response when determining the shaping filters is considered correspondingly in the entire processing chain.

In accordance with further embodiments, means for modulation 16, like a lookup table or a sine/cosine lookup table, may be provided on the output side of the noise generator 10', like downstream relative to the optional integrator 14. The lookup table 16 is configured to transfer, starting from a sum signal (like in the form of a frequency modulation), same to a phase modulation. The phase noise, output by the modulator 16, may be modulated onto a test signal by means of an optional mixer 18. It is to be pointed out here that the lookup table used for the phase modulation typically covers the complete definition range from—pi to +pi, wherein, however, it would also be conceivable for only a smaller range to be used with a very weakly modulated phase noise. This means that only this small range may also be loaded in order to save memory space or increase the resolution in this way.

Although above embodiments may have been discussed in connection with a device, it is to be pointed out that further embodiments also relate to a corresponding method. The method comprises the steps of: generating an output signal by means of a first noise source for a first frequency band of the frequency spectrum and filtering the output signal of the first noise source; generating an output signal by means of a second noise source for a second frequency band of the frequency spectrum and filtering the output signal of the second noise source. Here, filtering the output signal of the first noise source is done by means of a first sample rate, whereas filtering the output signal of the second noise source is done by means of a second sample rate. A ratio between the second sample rate and the first sample rate, with regard to a sign, corresponds to a ratio between center frequencies of the second frequency band and the first frequency band. In a third step, a sample rate of the filtered output signal of the first noise source is adjusted to a sample rate of the filtered output signal of the second noise source and the adjusted output signal of the first noise source and the output signal of the second noise source are combined.

This method may also be implemented in a computer-based manner, wherein it is of advantage here that this method, when compared to other known methods, such as the method described above using an FIR filter, consumes considerably less calculating time and memory for realization. In addition, it is to be pointed out that, in accordance with further embodiments, the above method is particularly suitable for being implemented on programmable logic, like an FPGA, for example. Since the sample rate of the individual filters differs, a resource-saving processing of the different bands in different time slots may be realized.

Although some aspects have been described in the context of a device, it is clear that these aspects also represent a description of the corresponding method, such that a block or element of a device also corresponds to a respective method step or a feature of a method step. Analogously, aspects described in the context of or as a method step also represent a description of a corresponding block or item or feature of a corresponding device. Some or all of the method steps may be executed by (or using) a hardware apparatus, like, for example, a microprocessor, a programmable computer or an electronic circuit. In some embodiments, some or several of the most important method steps may be executed by such an apparatus.

Depending on certain implementation requirements, embodiments of the invention may be implemented in hardware or in software. The implementation can be performed using a digital storage medium, for example a floppy disk, a DVD, a Blu-Ray disc, a CD, ROM, PROM, EPROM, EEPROM or a FLASH memory, a hard drive or another magnetic or optical memory having electronically readable control signals stored thereon, which cooperate or are capable of cooperating with a programmable computer system such that the respective method is performed. Therefore, the digital storage medium may be computer-readable.

Some embodiments according to the invention include a data carrier comprising electronically readable control signals, which are capable of cooperating with a programmable computer system, such that one of the methods described herein is performed.

Generally, embodiments of the present invention can be implemented as a computer program product with program code, the program code being operative for performing one of the methods when the computer program product runs on a computer. The program code may, for example, be stored on a machine-readable carrier.

Other embodiments comprise the computer program for performing one of the methods described herein, wherein the computer program is stored on a machine-readable carrier.

In other words, an embodiment of the inventive method is, therefore, a computer program comprising program code for performing one of the methods described herein, when the computer program runs on a computer.

A further embodiment of the inventive methods is, therefore, a data carrier (or a digital storage medium or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may, for example, be configured to be transferred via a data communication connection, for example via the Internet.

A further embodiment comprises processing means, for example a computer, or a programmable logic device, configured or adapted to perform one of the methods described herein.

A further embodiment comprises a computer having installed thereon the computer program for performing one of the methods described herein.

A further embodiment according to the invention comprises a device or a system configured to transfer a computer program for performing one of the methods described herein to a receiver. The transmission can be performed electronically or optically. The receiver may, for example, be a computer, a mobile device, a memory device or the like. The device or system may, for example, comprise a file server for transferring the computer program to the receiver.

In some embodiments, a programmable logic device (for example a field-programmable gate array, FPGA) may be used to perform some or all of the functionalities of the methods described herein. In some embodiments, a field-programmable gate array may cooperate with a microprocessor in order to perform one of the methods described herein. Generally, in some embodiments, the methods are performed by any hardware device. This can be universally applicable hardware, such as a computer processor (CPU), or hardware specific for the method, such as ASIC.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A noise generator for generating a noise signal over a frequency spectrum, comprising:
   a first noise source and a first digital filter for a first frequency band of the frequency spectrum, wherein the first digital filter is configured to filter the output signal of the first noise source;
   a second noise source and a second digital filter for a second frequency band of the frequency spectrum, wherein the second digital filter is configured to filter the output signal of the second noise source; and
   an interpolator and a combiner,
   wherein the first digital filter comprises a first sample rate, and wherein the second digital filter comprises a second sample rate, and wherein a sample rate increases with an increasing frequency of the frequency band,
   wherein the interpolator is configured to adjust an output signal of the first digital filter, with regard to its sample rate, to a sample rate of the second digital filter, and wherein the combiner is configured to combine the adjusted output signal from the interpolator and the output signal of the second digital filter,
   wherein an edge of the second digital filter which determines a lower frequency band limit is steeper than an edge of the first digital filter which determines an upper frequency band limit,
   wherein the noise generator comprises a third noise source and a third digital filter for a third frequency band of the frequency spectrum, wherein the third digital filter is configured to filter the output signal of the third noise source,
   wherein the third digital filter comprises a third sample rate, and wherein the sample rate increases with an increasing frequency of the frequency band, and
   wherein the noise generator comprises a further interpolator and a further combiner, wherein the further interpolator is configured to adjust an output signal of the combiner, with regard to its sample rate, to a sample rate of the third digital filter, and wherein the further combiner is configured to combine an output signal from the further interpolator and the output signal of the third digital filter.

2. The noise generator in accordance with claim 1, wherein a ratio between the steepness of the edge of the second digital filter and the edge of the first digital filter is dependent on the ratio between the second sample rate and the first sample rate.

3. The noise generator in accordance with claim 1, wherein the edge of the second digital filter is double as steep as the edge of the first digital filter.

4. The noise generator in accordance with claim 1, wherein the first and/or second noise source are/is configured to generate white noise and output same as an output signal.

5. The noise generator in accordance with claim 1, wherein a ratio is 2:1.

6. The noise generator in accordance with claim 1, wherein the interpolator is configured to double the output signal of the first filter with regard to its sample rate.

7. The noise generator in accordance with claim 1, wherein the combiner comprises a summing element.

8. The noise generator in accordance with claim 1, wherein the first and/or second digital filter comprise/s an FIR filter and/or RRC filter.

9. The noise generator in accordance with claim 1, wherein the second digital filter comprises a filter characteristic in accordance with which the edges comprise a differing steepness.

10. The noise generator in accordance with claim 9, wherein the edge of low transition frequency is double as steep as the edge of a high transition frequency of the second digital filter, or
wherein the edge of a low transition frequency is double as steep as an edge of a high transition frequency of the first digital filter.

11. The noise generator in accordance with claim 1, wherein the first and/or second digital filter are/is coupled to an adjuster for level adjustment on the output side.

12. The noise generator in accordance with claim 1, wherein the noise generator comprises an integrator on the output side, which is configured to sum up the combined output signals over time.

13. The noise generator in accordance with claim 1, wherein the noise generator comprises a modulator for modulation on the output side, which is configured to transfer the combined output signal from a frequency modulation to a phase modulation.

14. The noise generator in accordance with claim 13, wherein the modulator for modulation comprise a lookup table which comprises an association of sine/cosine values and phase values over an unlimited or limited range of values.

15. A method for generating a noise signal over a frequency spectrum, comprising:
generating an output signal by means of a first noise source for a first frequency band of the frequency spectrum and filtering the output signal of the first noise source;
generating an output signal by means of a second noise source for a second frequency band of the frequency spectrum and filtering the output signal of the second noise source, wherein filtering the output signal of the first noise source is performed by means of a first sample rate and filtering the output signal of the second noise source is performed by means of a second sample rate, and wherein a sample rate increases with an increasing frequency of the frequency band, and wherein an edge of the second digital filter which determines a lower frequency band limit is steeper than an edge of the first digital filter which determines an upper frequency band limit; and
adjusting a sample rate of the filtered output signal of the first noise source to a sample rate of the filtered output signal of the second noise source and combining the adjusted output signal of the first noise source and the output signal of the second noise source,
generating an output signal by means of a third noise source and filtering the output signal of the third noise source by use of a third digital filter for a third frequency band of the frequency spectrum, wherein filtering the output signal of the third noise source is performed by use of a third sample rate, and wherein the sample rate increases with an increasing frequency of the frequency band, and
adjusting an output signal of the filtered output signal of the second noise source to a sample rate of the filtered output signal of the third noise source with regard to its sample rate, to a sample rate of the third digital filter, and combining said output signal and the output signal of the third digital filter.

16. A non-transitory digital storage medium having stored thereon a computer program for performing a method for generating a noise signal over a frequency spectrum, comprising:
generating an output signal by means of a first noise source for a first frequency band of the frequency spectrum and filtering the output signal of the first noise source;
generating an output signal by means of a second noise source for a second frequency band of the frequency spectrum and filtering the output signal of the second noise source, wherein filtering the output signal of the first noise source is performed by means of a first sample rate and filtering the output signal of the second noise source is performed by means of a second sample rate, and wherein a sample rate increases with an increasing frequency of the frequency band, and wherein an edge of the second digital filter which determines a lower frequency band limit is steeper than an edge of the first digital filter which determines an upper frequency band limit; and
adjusting a sample rate of the filtered output signal of the first noise source to a sample rate of the filtered output signal of the second noise source and combining the adjusted output signal of the first noise source and the output signal of the second noise source,
generating an output signal by means of a third noise source and filtering the output signal of the third noise source by use of a third digital filter for a third frequency band of the frequency spectrum, wherein filtering the output signal of the third noise source is performed by use of a third sample rate, and wherein the sample rate increases with an increasing frequency of the frequency band, and
adjusting an output signal of the filtered output signal of the second noise source to a sample rate of the filtered output signal of the third noise source with regard to its sample rate, to a sample rate of the third digital filter, and combining said output signal and the output signal of the third digital filter;
when said computer program is run by a computer.

17. A noise generator for generating a noise signal over a frequency spectrum, comprising:
a first noise source and a first digital filter for a first frequency band of the frequency spectrum, wherein the first digital filter is configured to filter the output signal of the first noise source;
a second noise source and a second digital filter for a second frequency band of the frequency spectrum, wherein the second digital filter is configured to filter the output signal of the second noise source; and
an interpolator and a combiner,
wherein the first digital filter comprises a first sample rate, and wherein the second digital filter comprises a second sample rate, and wherein a ratio between the second sample rate and the first sample rate, with regard to a sign, corresponds to a ratio between center frequencies of the second frequency band and the first frequency band, wherein the interpolator is configured to adjust an output signal of the first digital filter, with regard to its sample rate, to a sample rate of the second digital filter, and wherein the combiner is configured to combine the adjusted output signal from the interpolator and the output signal of the second digital filter, wherein an edge of the second digital filter which determines a lower frequency band limit is steeper than an edge of the first digital filter which determines an upper frequency band limit, wherein the noise generator comprises a third noise source and a third digital filter for a third frequency band of the frequency spectrum, wherein the third digital filter is configured to filter the output signal of the third noise source, wherein the third digital filter comprises a third sample rate, and wherein the sample rate increases with an increasing frequency of the frequency band and wherein the noise generator comprises a further interpolator and a further combiner, wherein the further interpolator is configured to adjust an output signal of the combiner, with regard to its sample rate, to a sample rate of the third digital filter, and wherein the further combiner is configured to combine an output signal from the further interpolator and the output signal of the third digital filter.

18. A noise generator for generating a noise signal over a frequency spectrum, comprising:

a first noise source and a first digital filter for a first frequency band of the frequency spectrum, wherein the first digital filter is configured to filter the output signal of the first noise source;

a second noise source and a second digital filter for a second frequency band of the frequency spectrum, wherein the second digital filter is configured to filter the output signal of the second noise source; and an interpolator and a combiner, wherein the first digital filter comprises a first sample rate, and wherein the second digital filter comprises a second sample rate, and wherein a sample rate increases with an increasing frequency of the frequency band, wherein the interpolator is configured to adjust an output signal of the first digital filter, with regard to its sample rate, to a sample rate of the second digital filter, and wherein the combiner is configured to combine the adjusted output signal from the interpolator and the output signal of the second digital filter, wherein an edge of the second digital filter which determines a lower frequency band limit is steeper than an edge of the first digital filter which determines an upper frequency band limit;

wherein the noise generator comprises an integrator on the output side, which is configured to sum up the combined output signals over time;

or wherein the noise generator comprises a modulator for modulation on the output side, which is configured to transfer the combined output signal from a frequency modulation to a phase modulation.

* * * * *